(12) United States Patent
Manack et al.

(10) Patent No.: US 11,362,020 B2
(45) Date of Patent: Jun. 14, 2022

(54) FLIPCHIP PACKAGE WITH AN IC HAVING A COVERED CAVITY COMPRISING METAL POSTS

(71) Applicant: Texas Instruments Incorporated, Dallas, TX (US)

(72) Inventors: Christopher Daniel Manack, Flower Mound, TX (US); Jonathan Andrew Montoya, Dallas, TX (US); Jovenic Romero Esquejo, Baguio (PH); Salvatore Frank Pavone, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 39 days.

(21) Appl. No.: 17/098,930

(22) Filed: Nov. 16, 2020

(65) Prior Publication Data
US 2022/0157698 A1     May 19, 2022

(51) Int. Cl.
| | |
|---|---|
| *H01L 23/495* | (2006.01) |
| *H01L 23/498* | (2006.01) |
| *H01L 23/00* | (2006.01) |
| *H01L 21/50* | (2006.01) |
| *H01L 21/768* | (2006.01) |
| *H01L 23/31* | (2006.01) |
| *H01L 21/60* | (2006.01) |

(52) U.S. Cl.
CPC ........ *H01L 23/49503* (2013.01); *H01L 21/50* (2013.01); *H01L 21/76885* (2013.01); *H01L 23/31* (2013.01); *H01L 23/49805* (2013.01); *H01L 23/49816* (2013.01); *H01L 24/06* (2013.01); *H01L 24/14* (2013.01); *H01L 2021/60097* (2013.01)

(58) Field of Classification Search
CPC ............... H01L 23/49503; H01L 23/31; H01L 23/49805; H01L 23/49816; H01L 21/50; H01L 21/76885; H01L 24/06; H01L 24/14; H01L 2021/60097
USPC ........................................................ 257/676
See application file for complete search history.

(56) References Cited

U.S. PATENT DOCUMENTS

| | | | |
|---|---|---|---|
| 4,640,436 A | * | 2/1987 | Miyoshi .................. H01L 23/10 228/208 |
| 7,919,842 B2 | | 4/2011 | Manack et al. |
| 10,340,244 B2 | | 7/2019 | Bae et al. |

\* cited by examiner

*Primary Examiner* — Quoc D Hoang
(74) *Attorney, Agent, or Firm* — Ronald O. Neerings; Charles A. Brill; Frank D. Cimino

(57) ABSTRACT

A semiconductor package includes an IC having circuitry configured for at least one function with some nodes connected to bond pads, with first metal posts on the bond pads, and dome support metal posts configured in a ring having a top rim defining an inner cavity with solder on the top rim and extending over an area of the inner cavity for providing a solder dome that covers the inner cavity to provide a covered air cavity over a portion of the circuitry. A leadframe includes a plurality of leads or lead terminals. The IC is flipchip attached with a solder connection to the leadframe so that the first metal posts are attached to the leads or the lead terminals. A mold compound provides encapsulation for the semiconductor package except on at least a bottom side of the leads or lead terminals.

21 Claims, 4 Drawing Sheets

FLIPCHIP PACKAGE WITH AN IC HAVING A COVERED CAVITY COMPRISING METAL POSTS

FIELD

This Disclosure relates to flipchip semiconductor packages that include an integrated circuit (IC) including metal posts on the bond pads.

BACKGROUND

Precision components in plastic molded IC packages can be affected by the local stresses induced by the mold compound. There are several precision analog IC types, including analog ICs that comprise a voltage reference circuit. ICs having voltage reference circuits are designed so that their output voltage is stable. This is accomplished with circuit topologies and physical semiconductor (e.g., silicon) layouts that minimize their output voltage sensitivity to temperature, and by employing packaging methods that attempt to minimize output voltage variations from package-induced stress to the voltage reference circuit. There are three common types of voltage reference circuits, charged capacitor, zener, and bandgap. The most common voltage reference circuit type is a bandgap voltage reference circuit.

A bandgap voltage reference circuit is commonly used in mixed-signal ICs such as for analog-to-digital converters (ADCs) and digital-to-analog converters (DACs), for providing a fixed (or essentially constant) DC voltage independent of power supply variations, temperature changes, and loading. A bandgap voltage reference is known to be the combination of a bipolar (or diode) base-emitter junction voltage (Vbe) and a proportional to absolute temperature (PTAT) voltage. The Vbe for a silicon diode is known to be roughly 650 mV at room temperature, and the Vbe has a negative temperature coefficient (TC).

The mechanical stresses from the packaging material (e.g., the mold compound) can affect the precision achieved in a variety of analog and mixed signal circuits. For example, mold compound-induced mechanical stresses can result in for ADCs a non-linearity change over temperature, for amplifiers a change in the offset voltage, offset drift or gain variation, and for voltage references a voltage drift or degradation in its long-term voltage level stability.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize the attempt to minimize output variations from molded semiconductor packages due to mold compound induced stress is somewhat ineffective. This is primarily because the mold compound material impinges on pressure (or stress) sensitive regions of the IC in a non-uniform and unpredictable manner. For example, pressure from the mold material being thereon can introduce a piezoelectric effect on a bandgap voltage reference circuit that can shift the Vbe for bipolar devices or the threshold voltage for metal oxide semiconductor (MOS) devices, as well as the PTAT voltage (ΔVbe) for a bandgap voltage reference circuit.

Disclosed aspects include a semiconductor package that includes an IC comprising a substrate having circuitry configured for at least one function with some nodes connected to bond pads, with first metal posts (or pillars) on the bond pads, and other metal posts referred to herein as 'dome support' metal posts that are configured in a ring that has a top rim which defines an inner cavity. There is solder on the top rim extending over an area of the inner cavity for providing a solder dome over the inner cavity. As used herein, a 'ring' provided by the dome support metal posts means an enclosed shape, such as being circular or substantially circular, elliptical, rectangular, or being square-shaped. The ring can be a continuous ring throughout meaning providing full 360° coverage to encircle an area of the IC, or the ring can be a non-continuous ring that includes at least one gap between dome support metal posts, thus not providing full 360° coverage.

The solder dome covers the inner cavity to provide a solder capped cavity that is termed herein a covered air cavity, which is over a portion of the circuitry that is a pressure-sensitive portion (e.g., precision circuitry). The pressure-sensitive portion of the circuitry can comprise comprises less than 30 percent of an area of the IC. There is no need for bond pads to be positioned under disclosed dome support posts, although optionally the dome support metal posts can be on bond pads. The semiconductor package includes a leadframe including a plurality of leads or lead terminals. The IC is flipchip attached with a solder connection to the leadframe so that the first metal posts are attached to the leads or to the lead terminals. A mold compound provides encapsulation for the semiconductor package except on at least a bottom side of the leads or lead terminals, and particularly in the case the covered air cavity is a sealed air cavity, the mold compound is not within the air cavity.

The pressure-sensitive region(s) of the IC generally include precision circuitry, such as in the case of circuitry an ADC, DAC, or bandgap voltage reference circuit, as disclosed above. The pressure-sensitive regions can also include various sensor types, such as microelectromechanical systems (MEMS) sensors that may include a resonant cavity. Disclosed covered air cavities in the case of sealed air cavities prevent the mold compound applied during the molding step from entering, thus protecting the pressure-sensitive region(s) of the IC from mold compound-induced stress that would be the case if the mold compound were allowed to be in physical contact with the precision circuitry. Since the covered air cavity is formed on the IC during wafer fabrication, as opposed to a mold isolating structure alternatively being formed during the semiconductor package assembly process, disclosed aspects provide flexibility for the layout of the covered air cavity and the pressure-sensitive circuitry on the IC during wafer fabrication, thus without affecting any steps in the semiconductor package assembly process.

BRIEF DESCRIPTION OF THE DRAWINGS

Reference will now be made to the accompanying drawings, which are not necessarily drawn to scale, wherein:

FIG. 1A is a cross-sectional view showing an in-process IC comprising a substrate having circuitry coupled to bond pads of a metal layer that are exposed by openings in a passivation layer(s). FIG. 1B is a cross-sectional view showing the in-process IC after forming metal posts on the bond pads, and dome support metal posts to provide at least one ring defining an inner cavity around the pressure-sensitive region(s) of the IC. FIG. 1C is a cross-sectional view showing the in-process IC after optionally forming a rim of a solder-wettable metal on the rim of the metal posts. FIG. 1D is a cross-sectional view showing the in-process IC after depositing solder on the solder-wettable metal on the metal posts and the dome support metal posts. FIG. 1E is a cross-sectional view showing the in-process IC after solder reflow processing showing a roof of solder referred to herein as a solder dome spanning from rim to rim of the inner cavity to provide a disclosed covered air cavity that in the case the dome support metal posts provide a continuous ring provides a sealed air cavity.

DETAILED DESCRIPTION

Figure 1A:
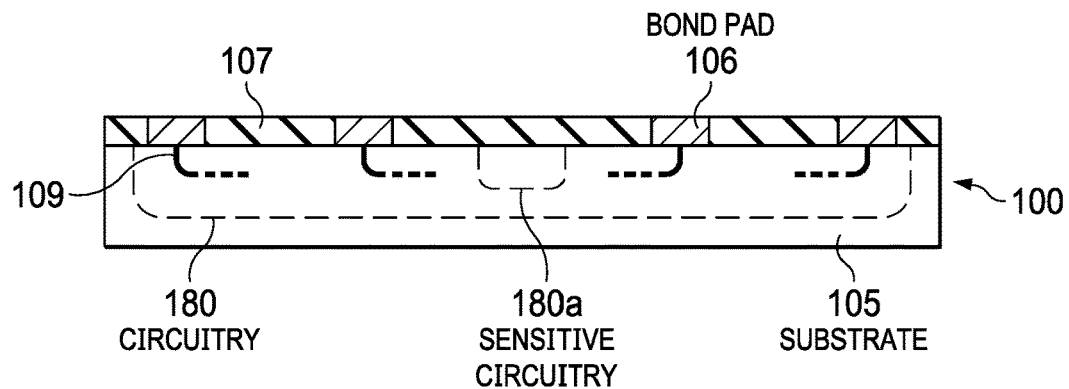
FIGS. 1A-E show successive cross-sectional views of an IC showing results from steps in an example method for forming a covered air cavity including a solder dome over a pressure-sensitive region of the IC that generally comprise precision circuitry, according to an example aspect.

Example aspects are described with reference to the drawings, wherein like reference numerals are used to designate similar or equivalent elements. Illustrated ordering of acts or events should not be considered as limiting, as some acts or events may occur in a different order and/or concurrently with other acts or events. Furthermore, some illustrated acts or events may not be required to implement a methodology in accordance with this Disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1A-E show successive cross-sectional views of an IC showing results from steps in an example method for forming a covered air cavity including a solder dome over a pressure-sensitive region of the IC, according to an example aspect. FIG. 1A is a cross-sectional view showing an in-process IC 100 comprising a substrate 105 having circuitry 180 including at least one instance of pressure-sensitive circuitry 180a with some nodes of the circuitry 180 shown coupled by couplings 109 to bond pads 106 of a metal layer, where the bond pads 106 are exposed by openings in at least one passivation layer 107. The circuitry 180 comprises circuit elements (including transistors, and generally diodes, resistors, capacitors, etc.) that may be optionally formed in an epitaxial layer on a bulk substrate material, where the circuit elements are configured together for generally realizing at least one circuit function.

Example circuit functions include analog (e.g., amplifier or power converter), radio frequency (RF), digital, or non-volatile memory functions. As noted above, the pressure-sensitive circuitry 180a generally comprises precision circuitry, such as an ADC, DAC, or a voltage reference circuit. The bond pads 106 are generally provided by a top metal layer of a multi-layer metal stack that includes inter-layer dielectric (ILD) layers between the respective metal layers. In one arrangement the passivation layer 107 comprises a polyimide layer. In other arrangements, the passivation layer 107 can comprise two or more different dielectric material layers.

Figure 1B:
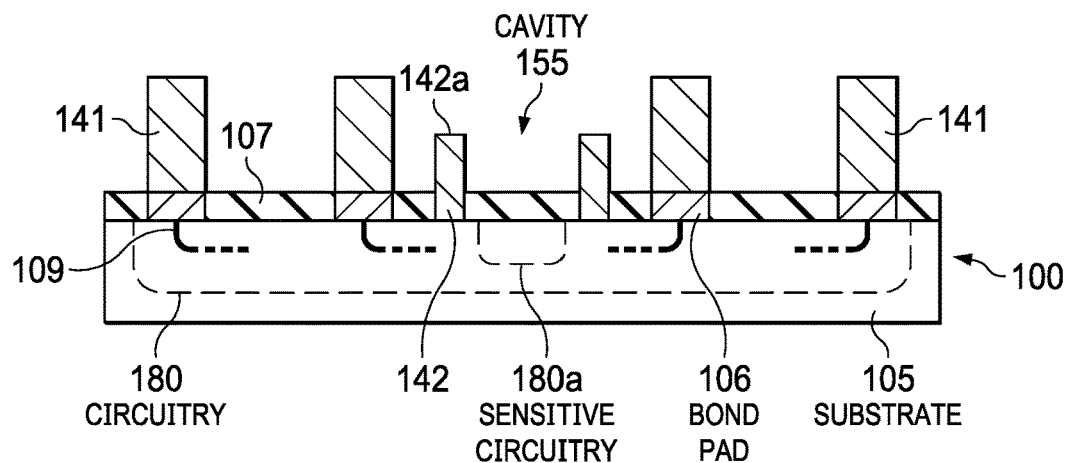

FIG. 1B is a cross-sectional view showing the in-process IC 100 after forming first metal posts 141 comprising a base metal, such as copper, on the bond pads 106, and also forming dome support metal posts 142 comprising a base metal positioned to provide at least one ring defining an inner cavity 155 around the pressure-sensitive circuitry 180a of the IC 100 that generally comprises precision circuitry. The dome support metal posts 142 are shown having a top rim 142a. The pressure-sensitive circuitry 180a can be seen to be positioned a selected distance inside the dome support metal posts 142, such as for example a distance of 20 μm to 80 μm.

Figure 1C:
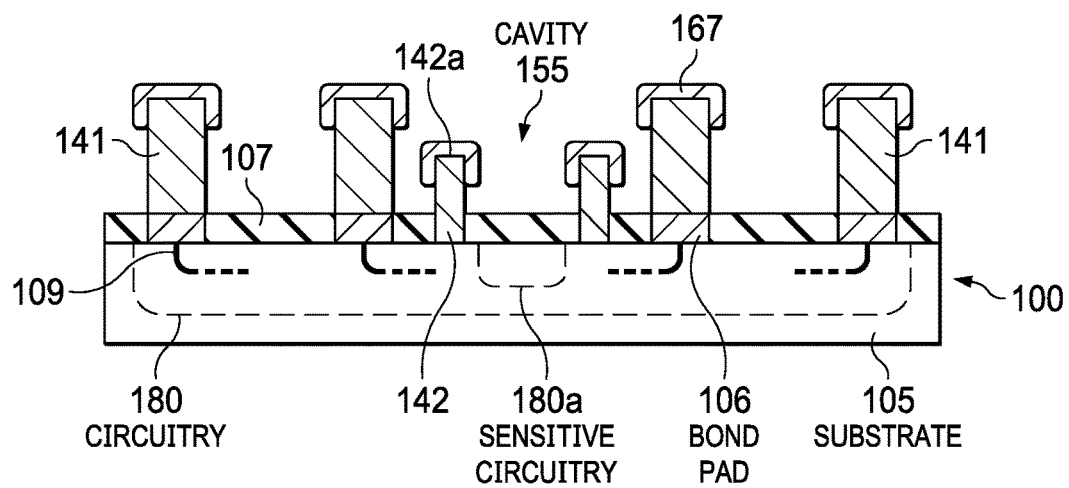

FIG. 1C is a cross-sectional view showing the in-process IC 100 after forming an optional solder-wettable metal layer 167 on the metal posts 141, 142, including on the top rim 142a of the dome support metal posts 142. The solder-wettable metal layer 167 is generally also formed on the first metal posts 141 as shown. The solder-wettable metal layer 167 application process can comprise depositing (generally by electroplating) a layer of nickel on the top rim of the base metal (e.g., copper) of the metal posts 141, 142, and then depositing a layer of a noble metal on the nickel. The noble metal can comprise gold, palladium, or a palladium-nickel alloy.

Figure 1D:
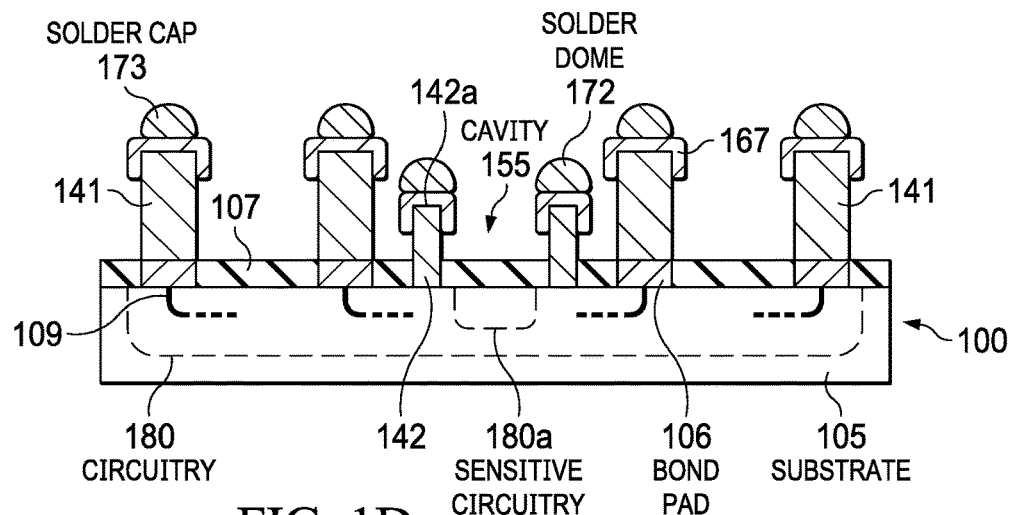
Figure 1E:
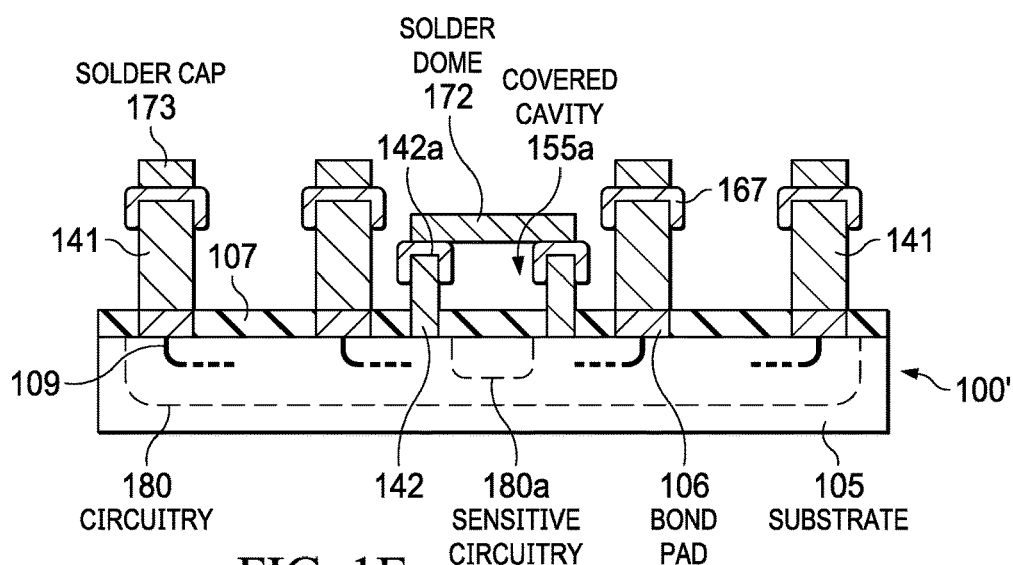

FIG. 1D is a cross-sectional view showing the in-process IC 100 after depositing solder on the solder-wettable metal layer 167 on the rims of the metal posts 141, 142. The inner cavity 155 will not be covered until a solder reflow process, describe relative to FIG. 1E. FIG. 1E is a cross-sectional view showing the in-process IC 100, now as IC 100' following a solder reflow process that results in covering the inner cavity 155 shown in FIG. 1D with a roof of solder shown as a solder dome 172 that spans from rim to rim of the inner cavity 155 to provide a covered air cavity 155a.

As described above, the covered air cavity in the case the dome support metal posts are configured in a continuous ring provide a sealed air cavity. A thickness of the solder dome 172 after reflow is generally 10 µm to 200 µm, which is a reduced thickness relative to the thickness of the solder before this reflow process due to the area of the solder increasing to span rim to rim across the inner cavity 155 to form the solder dome 172. The reduction in solder thickness for the solder dome 172 is in an amount that generally depends on the width of the dome support metal posts 142 and the amount of solder deposited. Solder caps 173 evidencing a reflow process are also shown on the first metal posts 141.

Separate process steps can be used for depositing the solder caps 173 and the solder dome 172, and it is also possible for the solder caps 173 and the solder dome 172 to be deposited in the same process step. This solder processing choice generally depends on the type(s) of solder deposition tools available. To position the solder dome 172 over the inner cavity a solder paste is generally used. The alignment of the solder paste onto the rims of the inner cavity or the solder-wettable metal layer 167 on the rims of the inner cavity to enable providing the solder dome 172 after solder reflow over the inner cavity can be performed through an alignment tool using a stencil that is fabricated to fit the design of the plurality of IC die (e.g., the location of the rims of the air cavity(ies)) on the wafer.

A mechanism described in the paragraph below is provided that is believed to explain the observed phenomena of solder spreading across the area of the inner cavity 155 to form a solder dome 172 that results in formation of a disclosed covered air cavity 155a. Although the mechanism described below is believed to be accurate, disclosed embodiments may be practiced independent of the particular mechanism(s) that may be operable.

Applicant has recognized, when a solder body, such as a patterned spherical-shape solder body, for example comprising a solder paste, is placed over the inner cavity 155 to rest on the top rim 142a of the dome support metal posts 142 or on a solder-wettable metal layer 167 if on the top rim 142a is reflowed using a sufficient reflow temperature and time at that temperature, the surface tension of the resulting liquid solder is reduced by the interfacial tension of the exposed metal of the dome support metal post 142. As a result, if the distance from rim to rim across the inner cavity 155 is sufficiently small, the liquid solder during the reflow process spreads over the surface of the top rim 142a or if present the solder-wettable metal layer 167 on the top rim 142a. The liquid solder thus stretches to form a plate-like roof over the inner cavity 155 thus extending rim to rim across the inner cavity 155. The distance from rim to rim can be up to about 1 mm and still form a solder dome 172 following solder reflow processing, which was confirmed by tests performed by the Inventors. After cooling a wafer having a plurality of the ICs, generally to room temperature, the liquid solder solidifies, resulting in a solder dome 172 providing a solder-to-metal seal which results in a disclosed covered air cavity 155a, that can be a sealed air cavity, including a hermetically sealed air cavity.

Figure 2A:
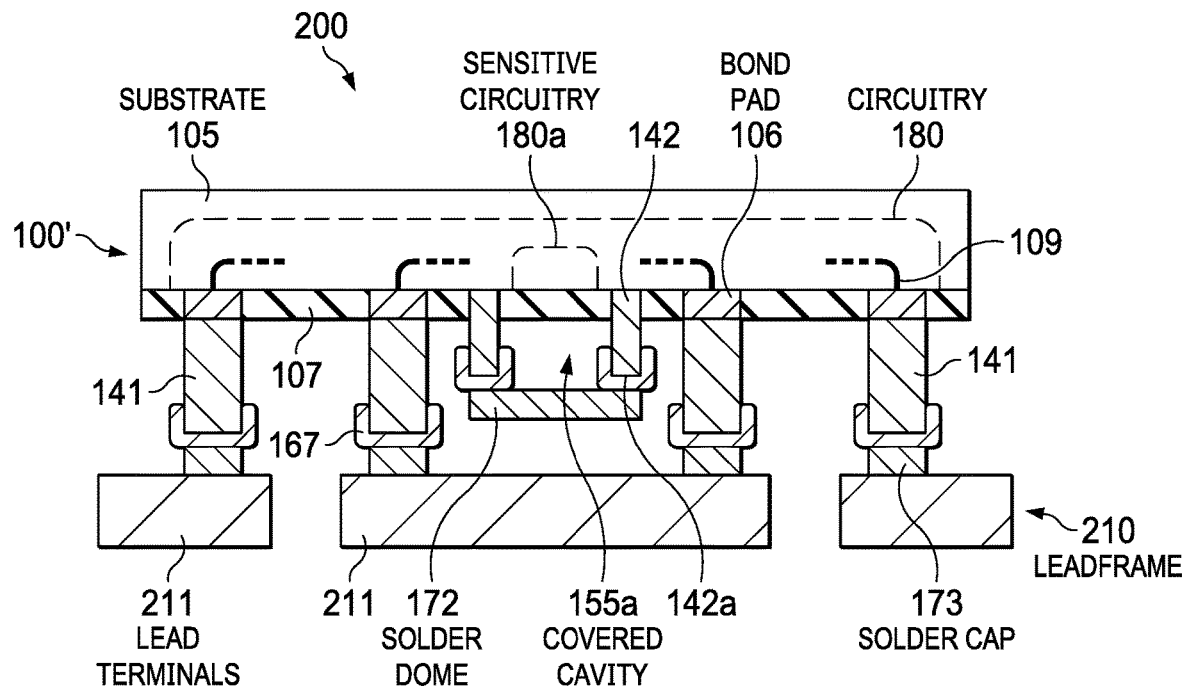
FIG. 2A shows a first step in a package assembly process comprising flipchip attaching the IC shown in FIG. 1E to lead terminals of a leadframe to form an in-process flipchip semiconductor package with an IC having a covered air cavity, with the leadframe shown as being a leadless leadframe, such as a QFN leadframe. The solder dome is shown remaining intact after this solder reflow process.

FIG. 2A shows results after a first step in an example package assembly process comprising flipchip attaching the IC 100' shown in FIG. 1E having the covered air cavity 155a to leads or lead terminals shown as lead terminals 211 of a leadframe 210 to form an in-process flipchip semiconductor package 200. The leadframe 210 is shown as being a leadless leadframe, such as a QFN leadframe. The covered air cavity 155a including its solder dome 172 is shown remaining intact after the solder reflow process that is used for the flipchip attaching.

Figure 2B:
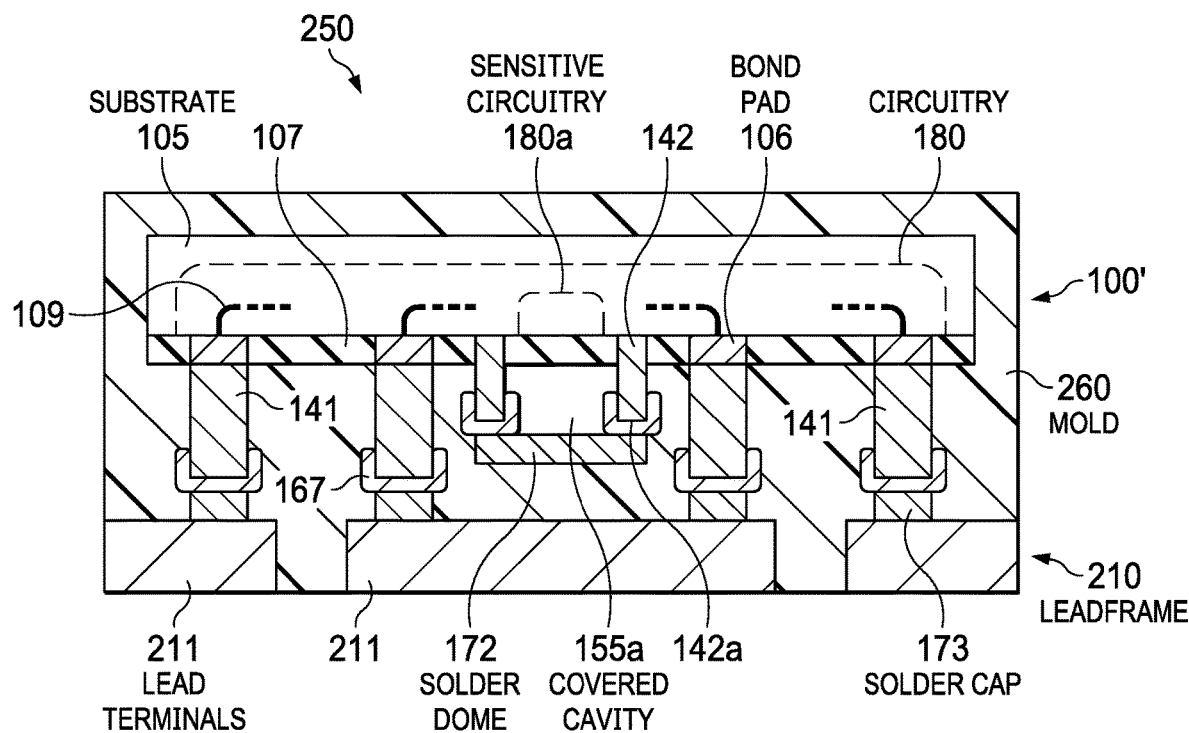
FIG. 2B shows an in-process flipchip semiconductor package now after molding and singulating it from a sheet of in-process flipchip packages.

FIG. 2B shows an in-process flipchip semiconductor package now shown as 250 after the molding of a mold compound shown as 260 and singulating the semiconductor package 250 from a sheet (or panel) of in-process flipchip packages. It is a significant technical advantage that no additional assembly steps are needed to provide a disclosed covered cavity, which as described above conventionally involves additional assembly steps for attaching a lid for sealing at least the top of the cavity. Since attaching a conventional lid is typically an expensive process, the disclosed covering method being performed while the ICs are in wafer form to provide a disclosed covered air cavity which as noted above can be a sealed air cavity, offers a comparatively low-cost cavity covering or cavity sealing method.

Figure 3A:
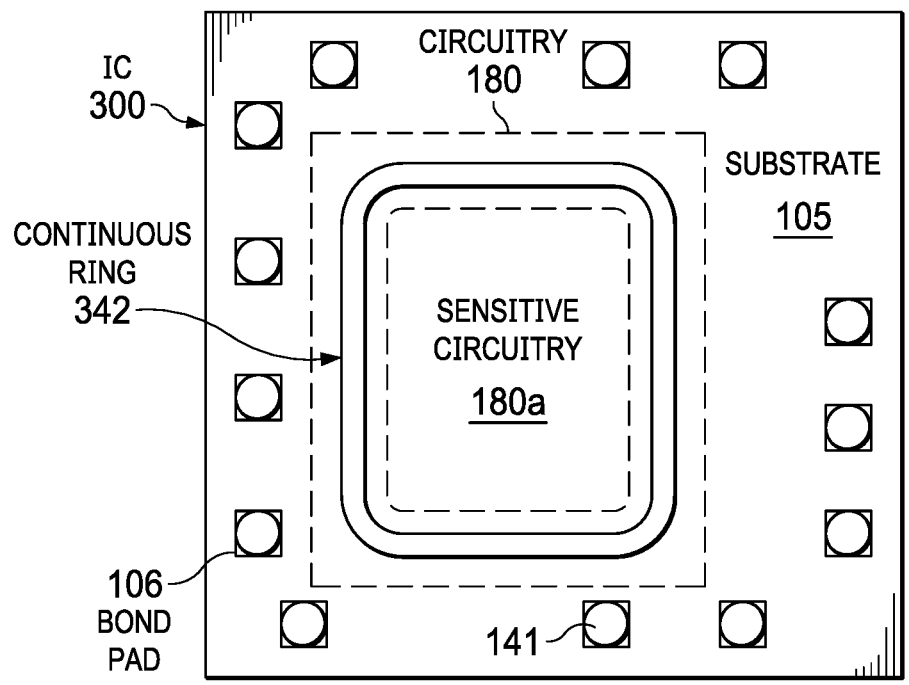
FIG. 3A shows an IC having the solder dome not shown to reveal the dome support metal posts providing a continuous ring which defines an inner cavity around the pressure-sensitive region of the IC. With the solder dome on top of the continuous ring, a sealed air cavity is provided.

As described above, the dome support metal posts can be configured in a single continuous ring or in a discontinuous ring that has gaps between the adjacent dome support metal posts. FIG. 3A shows an IC 300 having the solder dome not shown to reveal the dome support metal posts providing a continuous ring 342 which defines an inner cavity around the pressure-sensitive region 180a of the circuitry 180 on the IC. With the solder dome on top of the continuous ring 342 a sealed air cavity is provided, which can be a hermetically sealed air cavity. The bond pads 106 are again shown having first metal posts 141 thereon.

Figure 3B:
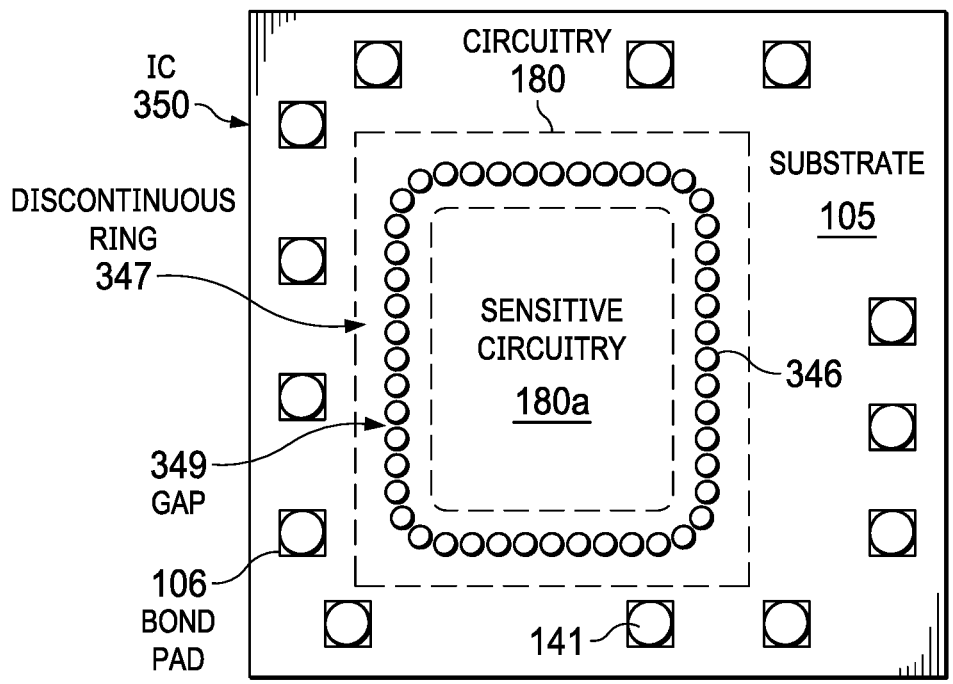
FIG. 3B shows an IC having the solder dome not shown to again reveal the dome support metal posts this time providing a discontinuous ring having gaps between the dome support metal posts, where the discontinuous ring defines an inner cavity around the pressure-sensitive region of the IC.

FIG. 3B shows an IC 350 having the solder dome not shown to again reveal the dome support metal posts 346 this time providing a discontinuous ring 347 having gaps 349 therebetween, where the discontinuous ring 347 defines an inner cavity around the pressure-sensitive circuitry 180a of the IC 350. A typical dimension for the dome support metal posts is 75 µm±30%, such as in one particular arrangement a 75 µm diameter. The gaps 349 between the dome support metal posts 346 may be 1 µm to 4 µm. Having gaps 349 between the dome support metal posts 346 enables outgassing of solder flux that may be in the cavity under the solder dome during solder reflow processing. Depending on the processing conditions during molding and the size of the gaps 349, a small amount of mold compound may enter the air cavity adjacent to the gaps 349 so that the mold compound does not reach the pressure-sensitive circuitry 180a which is positioned a selected distance inside the discontinuous ring 347.

EXAMPLES

Disclosed aspects are further illustrated by the following specific Examples, which should not be construed as limiting the scope or content of this Disclosure in any way.

Figure 4:
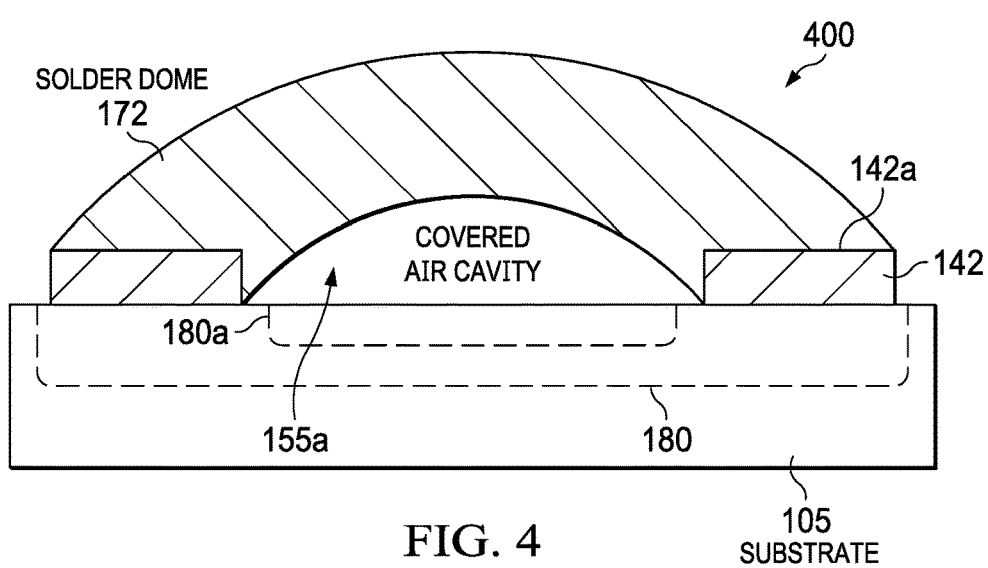
FIG. 4 is a scanned electron microscope (SEM) image showing a cross-sectional view of a disclosed covered air cavity on the surface of a silicon substrate having a solder dome on top of dome support metal posts comprising copper posts that are configured in a ring. The solder dome is shown providing a roof for the inner cavity after a solder reflow process comprising twice the nominal reflow time at the nominal reflow temperature. The solder dome can also be seen to remain intact even after this challenging solder reflow process, by continuing to provide a cover for the covered air cavity.

FIG. 4 is a scanned SEM image 400 showing a cross-sectional view of a disclosed covered air cavity 155a on the surface of a substrate 105 that comprised a silicon substrate having a solder dome 172 on top of the dome support metal posts 142 that comprised copper posts which were configured in a continuous ring. The solder dome 172 is shown providing a roof for the inner cavity after a solder reflow process comprising twice the nominal reflow time at the nominal reflow temperature. The reflow temperature used was 240 to 245° C., and the nominal reflow time defined to be when the reflow temperature was at least 220° C. was 50 seconds, so that the solder on the dome support metal posts 142 used to form the disclosed solder dome 172 received 100 seconds of reflow time. The solder dome 172 can be seen to remain intact even after this challenging solder reflow process, by continuing to provide a cover for the covered air cavity.

Disclosed aspects can be integrated into a variety of assembly flows to form a variety of different semiconductor packages and related products. The semiconductor package can comprise a single IC or multiple IC, such as configurations comprising a plurality of stacked IC, or laterally positioned IC. A variety of package substrates may be used. The IC may include various elements therein and/or layers thereon, including barrier layers, dielectric layers, device structures, active elements, and passive elements including source regions, drain regions, bit lines, bases, emitters, collectors, conductive lines, conductive vias, etc. Moreover, the IC can be formed from a variety of processes including bipolar, insulated-gate bipolar transistor (IGBT), CMOS, BiCMOS, and MEMS.

Those skilled in the art to which this Disclosure relates will appreciate that many variations of disclosed aspects are possible within the scope of the claimed invention, and further additions, deletions, substitutions, and modifications may be made to the above-described aspects without departing from the scope of this Disclosure.

The invention claimed is:

1. A semiconductor package, comprising:
an integrated circuit (IC) comprising a substrate including at least a semiconductor surface having circuitry configured for at least one function with some nodes of the circuitry connected to bond pads, with first metal posts on the bond pads, and dome support metal posts configured in a ring having a top rim defining an inner cavity with solder on the top rim extending over an area of the inner cavity for providing a dome of the solder that covers the inner cavity to provide a covered air cavity over a portion of the circuitry;
a leadframe including a plurality of leads or lead terminals;
wherein the IC is flipchip attached with a solder connection to the leadframe so that the first metal posts are attached to the leads or to the lead terminals, and
a mold compound providing encapsulation for the semiconductor package except on at least a bottom side of the leads or the lead terminals.

2. The semiconductor package of claim 1, wherein the ring is a continuous ring throughout so that the covered air cavity comprises a sealed air cavity, and wherein the mold compound is also excluded from being within the sealed air cavity.

3. The semiconductor package of claim 1, wherein the ring is a non-continuous ring that includes at least one gap.

4. The semiconductor package of claim 1, wherein the leadframe comprises a leadless lead frame.

5. The semiconductor package of claim 1, wherein the first metal posts and the dome support metal posts each comprise a base metal including copper, further comprising at least one solder wettable metal layer on the top rim of the first metal posts and on the dome support metal posts.

6. The semiconductor package of claim 5, wherein the at least one solder wettable metal comprises a layer of nickel, and a layer of a noble metal on the nickel, wherein the noble metal comprises at least one of gold, palladium, and a palladium-nickel alloy.

7. The semiconductor package of claim 1, wherein the portion of the circuitry comprises less than 30 percent of an area of the IC.

8. The semiconductor package of claim 1, wherein the portion of the circuitry comprises at least one of an analog-to-digital converter (ADC), a digital-to-analog converter (DAC), a bandgap voltage reference, and a Microelectromechanical systems (MEMS) sensor.

9. The semiconductor package of claim 1, wherein the IC includes at least one passivation layer, and wherein a bottom side of the covered air cavity is in physical contact with the passivation layer.

10. The semiconductor package of claim 1, wherein a thickness of the solder dome is from 10 µm to 200 µm.

11. A method, comprising:
providing an in-process integrated circuit (IC) comprising a substrate including at least a semiconductor surface having circuitry configured for at least one function with some nodes of the circuitry connected to bond pads of a metal layer that is exposed by openings in at least one passivation layer,
forming metal posts including first metal posts on the bond pads, and dome support metal posts configured in a ring having a top rim defining an inner cavity positioned over a portion of the circuitry, and
forming solder on the top rim extending over an area of the inner cavity for providing a dome of the solder that covers the inner cavity to provide a covered air cavity over the portion of the circuitry.

12. The method of claim 11, where the forming of the solder on the rim comprises depositing a defined area of a solder paste using a solder stencil, then reflowing the solder paste so that after the reflowing the solder paste the dome of the solder spans the area of the inner cavity.

13. The method of claim 11, further comprising:
providing a leadframe including a plurality of leads or lead terminals;
flipchip attaching the IC with a solder connection to the leadframe so that the first metal posts are attached to the leads or to the lead terminals, and
forming a mold compound providing encapsulation to provide a semiconductor package except on at least a bottom side of the leads or the lead terminals.

14. The method of claim 13, wherein the leadframe comprises a leadless lead frame.

15. The method of claim 11, wherein the first and the dome support metal posts both comprise a base metal comprising copper, further comprising forming at least one solder wettable metal on the rim before the forming of the solder.

16. The method of claim 15, wherein the at least one solder wettable metal comprises a layer of nickel on the rim, and a layer of a noble metal on the nickel, wherein the noble metal comprises gold, palladium, or a palladium-nickel alloy.

17. The method of claim 11, wherein the ring is a continuous ring throughout so that the covered air cavity comprises a sealed air cavity, and wherein the mold compound is also excluded from being within the sealed air cavity covered air cavity.

18. The method of claim 11, wherein the portion of the circuitry comprises less than 30 percent of an area of the IC.

19. The method of claim 11, wherein the portion of the circuitry comprises at least one of an analog-to-digital converter (ADC), a digital-to-analog converter (DAC), a bandgap voltage reference, and a Microelectromechanical systems (MEMS) sensor.

20. The method of claim 11, wherein a thickness of the dome of the solder is 10 µm to 200 µm.

21. The method of claim 11, wherein the ring is a non-continuous ring that includes at least one gap.

* * * * *